(12) United States Patent
Zhao et al.

(10) Patent No.: US 11,995,005 B2
(45) Date of Patent: May 28, 2024

(54) SEDRAM-BASED STACKED CACHE SYSTEM AND DEVICE AND CONTROLLING METHOD THEREFOR

(71) Applicant: BEIJING VCORE TECHNOLOGY CO., LTD., Beijing (CN)

(72) Inventors: Jiye Zhao, Beijing (CN); Dandan Huan, Beijing (CN)

(73) Assignee: BEIJING VCORE TECHNOLOGY CO., LTD., Beijing (CN)

( * ) Notice: Subject to any disclaimer, the term of this patent is extended or adjusted under 35 U.S.C. 154(b) by 182 days.

(21) Appl. No.: 17/708,130

(22) Filed: Mar. 30, 2022

(65) Prior Publication Data

US 2022/0276969 A1    Sep. 1, 2022

Related U.S. Application Data

(63) Continuation of application No. PCT/CN2021/096732, filed on May 28, 2021.

(30) Foreign Application Priority Data

Feb. 26, 2021  (CN) .......................... 202110214197.9

(51) Int. Cl.
*G11C 5/02* (2006.01)
*G06F 12/0811* (2016.01)
(Continued)

(52) U.S. Cl.
CPC ........ *G06F 12/128* (2013.01); *G06F 12/0811* (2013.01); *G06F 12/082* (2013.01);
(Continued)

(58) Field of Classification Search
CPC .. G06F 12/128; G06F 12/0811; G06F 12/082; G06F 2212/621; G06F 12/0895;
(Continued)

(56) References Cited

U.S. PATENT DOCUMENTS 8,737,108 B2 * 5/2014 Saraswat ................ G11C 5/063
                                                  365/51
9,158,619 B2 * 10/2015 Kobla ................ G11C 29/4401
(Continued)

FOREIGN PATENT DOCUMENTS

| CN | 110249427 A | 9/2019 |
| CN | 110731012 A | 1/2020 |
| CN | 112558889 A | 3/2021 |

OTHER PUBLICATIONS

CNIPA, Office Action for CN Application No. 202110214197.9, dated Apr. 6, 2021.
(Continued)

*Primary Examiner* — Tha-O H Bui
(74) *Attorney, Agent, or Firm* — Hodgson Russ LLP

(57) ABSTRACT

A SEDRAM-based stacked Cache system is integrated in multiple layers of wafers bonded together and includes a Cache, a Cache controller and a SEDRAM controller; the multiple layers of wafers includes a SEDRAM wafer structure and a processor wafer structure; a SEDRAM unit is integrated in each layer of SEDRAM wafer in the SEDRAM wafer structure and configured as a storage space of the Cache; a CPU, the Cache controller, the SEDRAM controller and a memory controller are integrated in the processor wafer structure.

19 Claims, 5 Drawing Sheets

(51) Int. Cl.
*G06F 12/0817* (2016.01)
*G06F 12/128* (2016.01)
*G11C 5/04* (2006.01)
*G11C 11/406* (2006.01)

(52) U.S. Cl.
CPC .......... *G11C 5/04* (2013.01); *G06F 2212/621* (2013.01); *G11C 11/40618* (2013.01); *G11C 11/40626* (2013.01); *G11C 2211/4061* (2013.01)

(58) Field of Classification Search
CPC .... G06F 3/0604; G06F 3/0614; G06F 3/0622; G06F 3/0656; G06F 9/5027; G11C 11/401; G11C 11/565
USPC .......................................................... 365/51
See application file for complete search history.

(56) References Cited

U.S. PATENT DOCUMENTS

| 10,304,802 | B2* | 5/2019 | Emma | ................ | G11C 29/006 |
| 11,270,917 | B2* | 3/2022 | Han | ................ | H01L 21/8232 |
| 2010/0268892 | A1* | 10/2010 | Luttrell | ................ | G06F 12/0862 |
| | | | | | 711/E12.001 |
| 2017/0123987 | A1* | 5/2017 | Cheng | ................ | G06F 15/7821 |

OTHER PUBLICATIONS

Xi'an Ziguang Guoxin, Heterogeneous Integrated Embedded DRAM(SeDRAM), IEDM, 2020.
DeepTech, Wuhan Xinxin 3D IC Technology Platform Realizes Infinite Possibilities of Wafer Stacking, Jun. 12, 2020.
WIPO, International Search Report for PCT/CN2021/096732, dated Oct. 11, 2021.

* cited by examiner

SEDRAM-BASED STACKED CACHE SYSTEM AND DEVICE AND CONTROLLING METHOD THEREFOR

CROSS-REFERENCE TO RELATED APPLICATIONS

This application is a continuation application of International Application No. PCT/CN2021/096732, filed May 28, 2021, which claims priority to Chinese Patent Application No. 202110214197.9, filed Feb. 26, 2021, the entire contents of which are incorporated herein by reference.

FIELD

The present disclosure relates to the technical field of computer memory system, and more particularly to a stacking embedded dynamic random access memory (SEDRAM)-based stacked Cache system and device and a controlling method therefor.

BACKGROUND

In the related art, a Cache is a small-capacity temporary storage of data and can be accessed more quickly than the main memory, which is composed of fast static random-access memories (SRAMs), and can be directly integrated in a chip of a central processing unit (CPU). The Cache is set between the CPU and the main memory, and active program blocks and data blocks of the main memory that are frequently accessed are copied to the Cache, so as to improve the speed of the CPU reading and writing instructions and data. Due to the locality of program access, in most cases, the CPU can directly acquire instructions and data from the Cache without accessing the main memory.

However, the integration level of the SRAM is low, and the SRAM has a larger volume than a dynamic random access memory (DRAM) which can be designed to be smaller with a same capacity. Moreover, the SRAM is expensive, which is also an important reason not to increase the capacity of the SRAM. Furthermore, an increase in capacity will inevitably lead to an increase in the number of transistors inside the CPU, but integrating a larger Cache on a limited CPU area requires a higher manufacturing process. For example, IBM's latest Power 9 processor only has a Cache capacity of 120 MB; while Xeon Platinum server chip from Intel also only has a Cache capacity of 38.5 MB.

SUMMARY

Embodiments of the present disclosure provide a SEDRAM-based stacked Cache system, a controlling method therefor and a Cache device. The stacked Cache system adopts a SEDRAM unit as a storage space of a Cache, and a processor wafer and a SEDRAM wafer integrated with the SEDRAM unit is directly bonded, so that the capacity of the Cache is expanded to a level of GB (Gigabyte, $2^{20}$ bytes), which is improved by at least an order of magnitude as compared with the capacity of a traditional Cache.

In a first aspect, embodiments of the present disclosure provide a SEDRAM-based stacked Cache system, integrated in multiple layers of wafers bonded together, and including a Cache, a Cache controller and a SEDRAM controller; wherein the multiple layers of wafers include a SEDRAM wafer structure and a processor wafer structure;

the SEDRAM wafer structure includes at least one layer of SEDRAM wafer, and a SEDRAM unit is integrated in each layer of SEDRAM wafer in the SEDRAM wafer structure and configured as a storage space of the Cache;

the processor wafer structure includes at least one layer of processor wafer; and a CPU, the Cache controller, the SEDRAM controller and a memory controller are integrated in the processor wafer structure;

data is transferred between wafers through a bonding structure in pin-to-pin data direct transmission, including:

pin-to-pin data direct transmission between the SEDRAM wafer of the SEDRAM wafer structure and the processor wafer of the processor wafer structure through a bonding structure;

pin-to-pin data direct transmission between the SEDRAM wafers of the SEDRAM wafer structure through a bonding structure;

pin-to-pin data direct transmission between the processor wafers of the processor wafer structure through a bonding structure.

In combination with the first aspect, in a second possible implementation, the Cache controller is configured to determine whether the Cache hits, and send corresponding command operation and data interaction request to the CPU, the SEDRAM controller and the memory controller; and the SEDRAM controller is configured to control reading or writing content in the SEDRAM unit.

In combination with the second possible implementation of the first aspect, in a third possible implementation, content stored in the SEDRAM unit includes Cache Control and Cache Data, and the Cache Control includes a Cache State and a Cache Tag.

In combination with the third possible implementation of the first aspect, in a fourth possible implementation, the Cache Control further includes Directory information.

In combination with the first aspect, in a fifth possible implementation, the stacked Cache system further includes a Cache SRAM integrated in the processor wafer structure, and the SEDRAM unit and the Cache SRAM are configured as the storage space of the Cache.

In combination with the fifth possible implementation of the first aspect, in a sixth possible implementation, the Cache controller is configured to determine whether the Cache hits, and send corresponding command operation and data interaction request to the CPU, the SEDRAM controller and the memory controller; the SEDRAM controller is configured to control reading or writing content in the SEDRAM unit; and the Cache controller is further configured to read out or write content in the Cache SRAM.

In combination with the sixth possible implementation of the first aspect, in a seventh possible implementation, the content stored in the SEDRAM unit is a Cache Data; the content stored in the Cache SRAM is Cache Control; and the Cache Control includes a Cache State and a Cache Tag.

In combination with the seventh possible implementation of the first aspect, in an eighth possible implementation, the Cache Control further includes Directory information.

In combination with any one of the first aspect and the first to eighth possible implementations, in a ninth possible implementation, the SEDRAM unit is configured as a storage space for any level of the Cache.

In combination with the ninth possible implementation of the first aspect, in a tenth possible implementation, the processor wafer structure includes one layer of processor wafer, and the SEDRAM wafer structure includes one or two layers of SEDRAM wafers.

In combination with any one of the first aspect and the first to eighth possible implementations, in an eleventh possible implementation, the processor wafer structure includes one layer of processor wafer, and the SEDRAM wafer structure includes one or two layers of SEDRAM wafers.

In a second aspect, there is provided a Cache controlling method for the stacked Cache system as described in any possible implementation above, the SEDRAM unit integrated in each layer of SEDRAM wafer in the SEDRAM wafer structure is controlled by the Cache controlling method as an overall storage space of the Cache, and both Cache Control and Cache Data are stored in the SEDRAM unit. The Cache controlling method includes:

step 1: outputting an access address by the CPU integrated in the processor wafer structure;

step 2: sending a read request by the Cache controller integrated in the processor wafer structure to the SEDRAM controller integrated in the processor wafer structure according to the access address, and reading out Cache Lines from the SEDRAM unit by the SEDRAM controller, wherein each Cache Line includes the Cache Control and the Cache Data, and the Cache Control includes a Cache State and a Cache Tag;

step 3: performing address comparison between bits corresponding to a tag in the access address and the Cache Tag in each Cache Line read out;

step 4: determining that the Cache hits if the bits corresponding to the tag in the access address are identical to the Cache Tag in a Cache way of the Cache, and a state bit of a corresponding Cache Line is valid, otherwise, determining that the Cache misses;

step 5: if it is determined that the Cache hits, directly reading, by the Cache controller, the Cache Data in the corresponding Cache Line back to the CPU as a result of a current access operation, and directly executing step 10;

step 6: if it is determined that the Cache misses, and if there exists a next level of Cache, sending an access request to the next level of Cache by the Cache controller, and waiting for return of data corresponding to the access request; and executing step 8 when the data corresponding to the access request is returned to the Cache controller;

step 7: if it is determined that the Cache misses, and a current level of Cache is a last level of Cache, directly sending, by the Cache controller, an access request to a main memory through the memory controller integrated in the processor wafer structure, and waiting for return of data corresponding to the access request; and executing step 8 when the data corresponding to the access request is returned to the Cache controller;

step 8: sending the returned data to the CPU by the Cache controller, and finding a Cache Line in a Cache way of the Cache through a Cache replacement algorithm as a replacement Cache Line; and performing a write-back operation to a storage block depending on a write strategy of the Cache and the case where the replacement Cache Line is an unused Cache Line, a used but not dirty Cache Line or a dirty Cache Line;

step 9: refilling, by the Cache controller, the returned data to a storage space of the SEDRAM unit corresponding to the replacement Cache Line by performing a write operation to the SEDRAM unit of the SEDRAM wafer structure corresponding to a write address, wherein the write operation is sent by the SEDRAM controller, the write address of the write operation is given by the Cache controller according to the replacement Cache Line found out in step 8, write data is entire content to be written to the Cache Line and includes Cache Control and Cache Data, information of the Cache Control is determined based on the access request, and content of the Cache Data is determined by the returned data; and step 10: ending a current Cache access operation.

In a third aspect, there is provided a Cache controlling method for the stacked Cache system as described in any possible implementation above, the SEDRAM unit integrated in each layer of SEDRAM wafer in the SEDRAM wafer structure is controlled by the Cache controlling method as a part of the storage space of the Cache, Cache Data is stored in the SEDRAM unit, and Cache Control is stored in the Cache SRAM integrated in the processor wafer structure. The Cache controlling method includes:

step 1: outputting an access address by the CPU integrated in the processor wafer structure;

step 2: accessing the Cache SRAM by the Cache controller integrated in the processor wafer structure according to the access address to read out corresponding Cache Controls from the Cache SRAM, wherein each Cache Control read from the Cache SRAM includes a Cache State and a Cache Tag;

step 3: performing address comparison between bits corresponding to a tag in the access address and each Cache Tag read from the Cache SRAM;

step 4: determining that the Cache hits if the bits corresponding to the tag in the access address are identical to the Cache Tag in a Cache way of the Cache, and a state bit of a corresponding Cache Line is valid, otherwise, determining that the Cache misses;

step 5: if it is determined that the Cache hits, reading, by the SEDRAM controller integrated in the processor wafer structure according to the access address, content of Cache Data in the Cache Line corresponding to the access address from the SEDRAM unit as a result of a current access operation, and directly executing step 10;

step 6: if it is determined that the Cache misses, and if there exists a next level of Cache, sending an access request to the next level of Cache by the Cache controller, and waiting for return of data corresponding to the access request; and executing step 8 when the data corresponding to the access request is returned to the Cache controller;

step 7: if it is determined that the Cache misses, and a current level of Cache is a last level of Cache, directly sending, by the Cache controller, an access request to a main memory through the memory controller integrated in the processor wafer, and waiting for return of data corresponding to the access request; and executing step 8 when the data corresponding to the access request is returned to the Cache controller;

step 8: sending the returned data to the CPU by the Cache controller, and finding a Cache Line in a Cache way of the Cache through a Cache replacement algorithm as a replacement Cache Line; and performing a write-back operation to a storage block depending on a write strategy of the Cache and the case where the replacement Cache Line is an unused Cache Line, a used but not dirty Cache Line or a dirty Cache Line;

step 9: refilling, by the Cache controller, Cache Control and Cache Data of the replacement Cache Line, wherein content of the Cache Control is determined according to the access request and refilled into a storage space of the Cache SRAM corresponding to the replacement Cache Line by the Cache controller; content of the Cache Data is determined according to the returned data and refilled into a storage space of the SEDRAM unit corresponding to the replacement Cache Line by performing a write operation to the SEDRAM unit of the SEDRAM wafer structure corresponding to a write address, the write operation is sent by the SEDRAM controller, and the write address is given by the Cache controller according to the replacement Cache Line; and step 10: ending a current Cache access operation.

In a fourth aspect, there is provided a SEDRAM-based stacked Cache device, including the stacked Cache system as described in any of the above-mentioned eleven possible implementations in the first aspect.

According to the SEDRAM-based stacked Cache system, the Cache controlling method and the Cache device provided in the first to fourth aspects, the SEDRAM unit is adopted as the storage space of the Cache in the Cache system, which can expand the capacity of the Cache significantly, realize fast and short-distance data transmission between wafers with different functions and different processes, and effectively break through the limitation of a "Memory Wall" to create real storage-computing integration.

According to the SEDRAM-based stacked Cache system, the Cache controlling method and the Cache device provided in the first to fourth aspects, the SEDRAM unit is adopted as the overall storage space of the Cache or as the overall storage space of a level of Cache in the Cache system, and the processor wafer is directly bonded with the SEDRAM wafer having the SEDRAM unit integrated therein, so that the capacity of Cache is expanded to a level of GB (Gigabyte, $2^{20}$ bytes), which is improved by at least an order of magnitude as compared with the capacity of a traditional Cache. At the same time, a hit rate of the Cache is improved, reading speed of hot data is accelerated, a hit rate of the CPU to read inside data is improved, comprehensive performances of the system are improved, and cost, power consumption and latency are reduced. Besides, a data transmission average bandwidth of memory system is increased significantly, storage resources of a processor chip are saved, so that more processing logics (such as more artificial intelligence (AI) cores or other coprocessor cores) are integrated on a chip of the same size to achieve more functions and stronger computing capability.

According to the SEDRAM-based stacked Cache system, the Cache controlling method and the Cache device provided in the first to fourth aspects, the SEDRAM unit is adopted as a part of the storage space of the Cache or as a part of the storage space of a level of Cache in the Cache system, so that the Cache SRAM in the chip is able to store more Cache Control, and the capacity of the Cache is expanded to a level of GB (Gigabyte, $2^{20}$ bytes), which is improved by at least an order of magnitude as compared with the capacity of a traditional Cache. At the same time, a hit rate of the Cache is improved, reading speed of hot data is accelerated, a hit rate of the CPU to read inside data is improved, comprehensive performances of the system are improved, cost, power consumption and latency are reduced, and a data transmission average bandwidth of memory system is increased significantly.

BRIEF DESCRIPTION OF THE DRAWINGS

In order to illustrate the embodiments of the present disclosure more clearly, drawings which may be used in the description of embodiments will be briefly introduced below. It will be understood that the following drawings only show some embodiments of the present disclosure, and thus shall not be construed to limit the scope of the present disclosure, and other related drawings can also be obtained by those skilled in the art based on these drawings without any creative effort.

DETAILED DESCRIPTION

Figure 1:
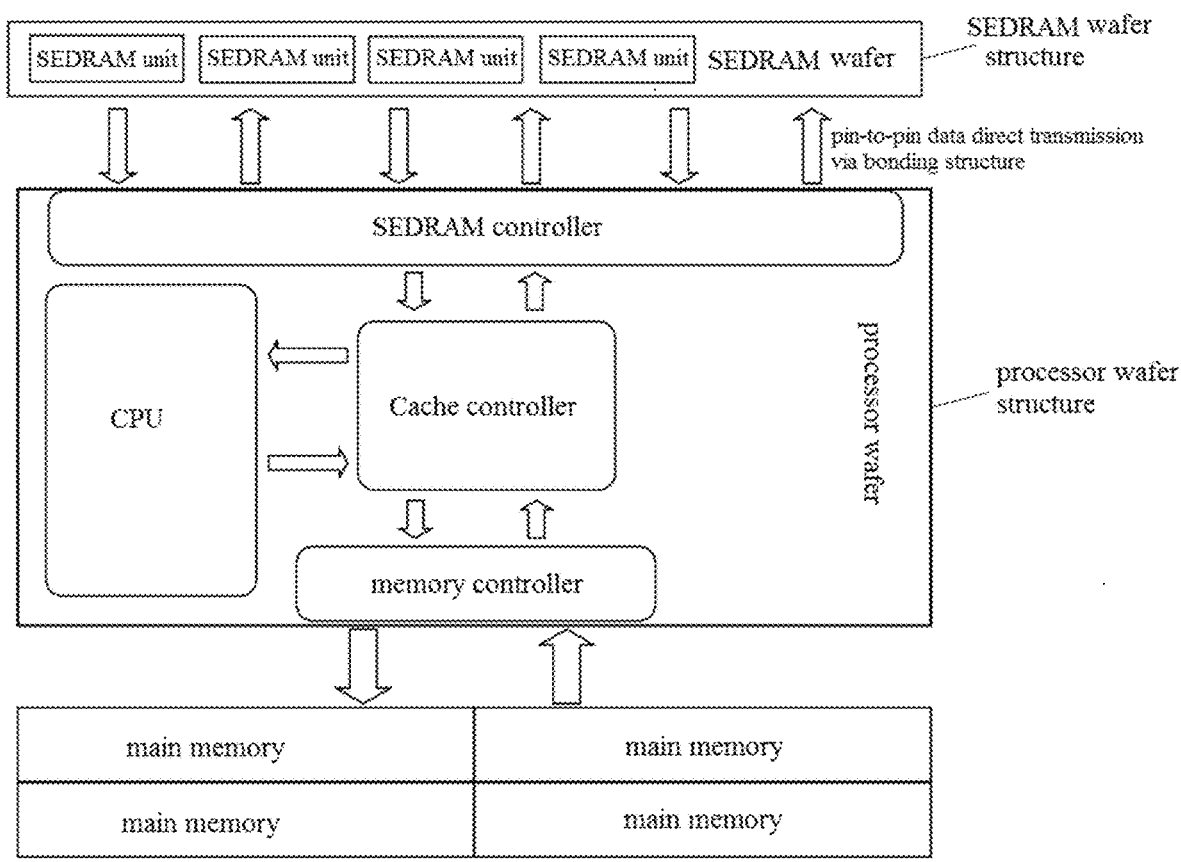
FIG. 1 is a schematic diagram of a stacked Cache system adopting a SEDRAM as an overall storage space of a Cache according to an embodiment of the present disclosure.

Embodiments of the present disclosure will be described clearly below with reference to accompanying drawings. Evidently, the embodiments described herein are only some embodiments of the present disclosure, rather than all embodiments of the present disclosure. Other embodiments obtainable by those skilled in the art based on the embodiments described herein without creative efforts belong to the scope of the present disclosure.

In embodiments of the present disclosure, a SEDRAM (i.e., a stacking embedded dynamic random access memory or a three-dimensional stacking embedded dynamic random access memory) has a structure like DRAM (dynamic random access memory). In the SEDRAM, several wafers or a wafer and a chip are connected to each other in a vertical direction by a nano-scale interconnection technology. A two-wafer stacking technology (i.e., S-stacking technology for short) or a multi-wafer stacking technology (i.e., M-stacking technology for short) can realize direct metal interconnection of two or more wafers with different processes and different functions to achieve higher interconnection density and alignment accuracy. The S-stacking technology and the M-stacking technology can directly stack a SEDRAM wafer and a logic wafer together, so as to process an architecture in parallel and efficiently, realize fast data transmission between wafers with different functions, achieve a shorter connection distance, and increase the connection speed and the number of channels.

The SEDRAM was disclosed in a technical article (titled A Stacked Embedded DRAM Array for LPDDR4/4X using Hybrid Bonding 3D Integration with 34 GB/s/1 Gb 0.88 pJ/b Logic-to-Memory Interface) issued on $63^{th}$ International Electronic Devices Congress (IEDM 2020).

A Cache is usually divided into a plurality of levels, each level can be divided into a plurality of Cache ways, and each way includes a plurality of Cache Lines. Each Cache Line, as a basic storage block, is composed by a Cache control area (referred to as a Cache Control for short) and a Cache data area (referred to as a Cache Data for short). The Cache Control is further divided into a Cache state area (referred to as a Cache State for short) and a Cache tag area (referred to as a Cache Tag for short). Further, a multi-core processor system also includes a directory area (referred to as Directory) information, etc.

The Cache State represents a status of its Cache Line, includes marking whether this Cache Line holds valid data (a valid bit), and only if a memory address has been accessed before, its data will be stored in a corresponding Cache Line, and a corresponding valid bit will be set to 1; or marking whether this Cache Line has latest written data (a dirty bit), i.e., whether the data is consistent with a next level of storage system (i.e., a next level of Cache or memory).

The Cache Tag is configured to store an address corresponding to the data of the Cache Line, which is used to determine whether the Cache Line is the content corresponding to a current access address.

The Directory is configured to record information related to multi-core consistency, such as recoding which processor core in the multi-core processor has the data backup of the Cache Line, and whether the data is used exclusively or shared, and other information.

The Cache Data is configured to store data for use by a CPU.

Besides the Cache State, the Cache Tag, and the Directory, the Cache Control in the Cache Line may also include an age bit, an instruction flag bit, and a prefetching algorithm flag bit. The age bit refers to the age of a Cache Line used by a Cache replacement algorithm. The instruction flag bit is configured to indicate what stored in the Cache Line is an instruction or data. The prefetching algorithm flag bit is configured to whether the data is prefetched.

Embodiments of the present disclosure provide a SEDRAM-based stacked Cache system, a controlling method therefor and a Cache device. The stacked Cache system is integrated in multiple layers of wafers bonded together and includes a Cache, a Cache controller and a SEDRAM controller. In the stacked Cache system, a SEDRAM unit is used as a storage space of the Cache, and a processor wafer and a SEDRAM wafer with the SEDRAM unit integrated therein are directly bonded, so that the capacity of the Cache is expanded to a level of GB (Gigabyte, $2^{20}$ bytes), which is improved by at least an order of magnitude as compared with the capacity of a traditional Cache.

Embodiment 1

Figure 3:
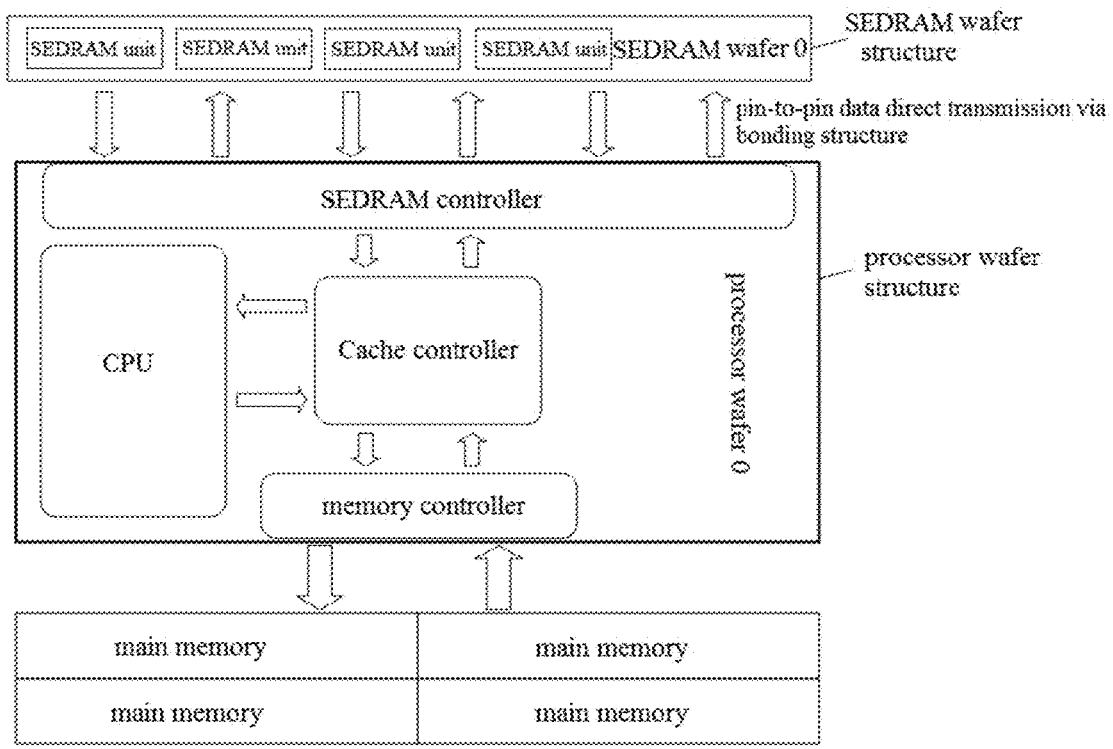
FIG. 3 is a schematic diagram of a stacked Cache system including a SEDRAM and a CPU according to an embodiment of the present disclosure.

Referring to FIG. 1 and FIG. 3, this embodiment provides a SEDRAM-based stacked Cache system. The stacked Cache system is integrated in multiple layers of wafers bonded together, and includes a Cache, a Cache controller and a SEDRAM controller. The SEDRAM controller may be configured as single-channel or multi-channel parallel access. Depending on the number of banks of the SEDRAM, the stacked Cache system may include one or more SEDRAM controllers.

The multiple layers of wafers include a SEDRAM wafer structure and a processor wafer structure, the SEDRAM wafer structure includes at least one layer of SEDRAM wafer, and the processor wafer structure includes at least one layer of processor wafer. That is, the multiple layers of wafers bonded together may include one layer of processor wafer and one layer of SEDRAM wafer, or the multiple layers of wafers bonded together may include one layer of processor wafer and two layers of SEDRAM wafers, or the multiple layers of wafers bonded together may include two layers of processor wafers and one layer of SEDRAM wafer. The specific number of layers of the processor wafers in the processor wafer structure and the specific number of layers of the SEDRAM wafers in the SEDRAM wafer structure may be determined as required. For example, the stacked Cache system as illustrated in FIG. 3 includes one layer of SEDRAM wafer and one layer of processor wafer, i.e., the SEDRAM wafer 0 and the processor wafer 0.

SEDRAM units are integrated in each layer of SEDRAM wafer in the SEDRAM wafer structure and configured as an overall storage space of the Cache in the Cache system or configured as an overall storage space of a level of Cache. As illustrated in FIG. 3, the SEDRAM units are integrated in the SEDRAM wafer 0 and configured as the overall storage space of the Cache in the Cache system to store Cache Data and Cache Control of a Cache Line. Moreover, the processor wafer 0 is integrated with a CPU, the Cache controller, the SEDRAM controller and a memory controller. Data is transferred between wafers through a bonding structure in pin-to-pin data direct transmission. It should be noted that the expression "between wafers" may refer to between the SEDRAM wafer and the processor wafer, between any two SEDRAM wafers, or between any two processor wafers.

All logical modules integrated on the multiple layers of wafers constitute a complete processor system. A main memory is generally integrated on a mainboard outside the chip. An entire SEDRAM wafer and an entire processor wafer may be bonded first and then sliced and packed.

The Cache controller is a control core of the stacked Cache system, and may be configured to determine whether the Cache in the Cache system hits and send corresponding command operation and data interaction request to the CPU, the SEDRAM controller and the memory controller. The SEDRAM controller is configured to control reading or writing content in the SEDRAM unit.

Further, content stored in the SEDRAM unit includes Cache Control and Cache Data, and the Cache Control includes a Cache State and a Cache Tag. Further, the Cache Control may also include Directory information.

The SEDRAM unit is adopted as the overall storage space of the Cache or as the overall storage space of a level of Cache in the Cache system, and the processor wafer is directly bonded with the SEDRAM wafer having the SEDRAM unit integrated therein, so that the capacity of the Cache is expanded to a level of GB (Gigabyte, $2^{20}$ bytes), which is improved by at least an order of magnitude as compared with the capacity of a traditional Cache. At the same time, a hit rate of the Cache is improved, reading speed of hot data is accelerated, a hit rate of the CPU to read inside data is improved, comprehensive performances of the system are improved, and cost, power consumption and latency are reduced. Besides, a data transmission average bandwidth of memory system is increased significantly, storage resources of a processor chip are saved, so that more processing logics (such as more artificial intelligence (AI) cores or other coprocessor cores) are integrated on a chip of the same size to achieve more functions and stronger computing capability.

Embodiment 2

Figure 2:
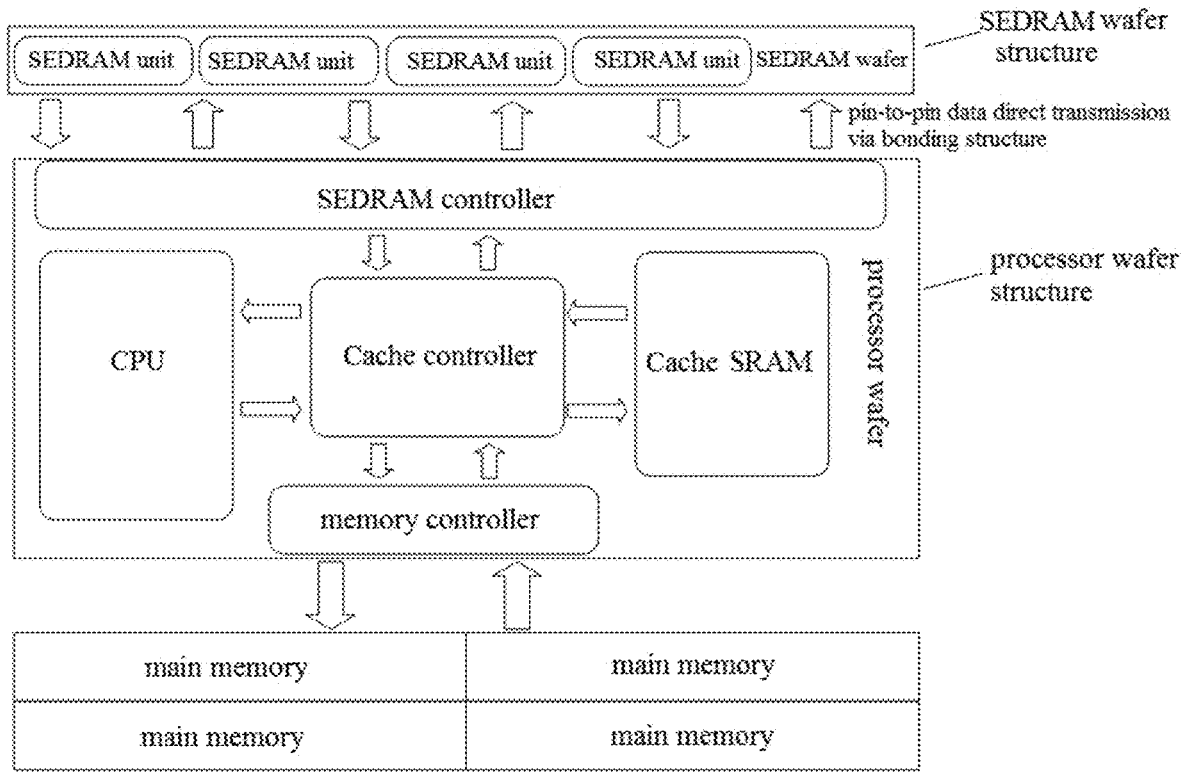
FIG. 2 is a schematic diagram of a stacked Cache system adopting a SEDRAM as a part of a storage space of a Cache according to an embodiment of the present disclosure.
Figure 4:
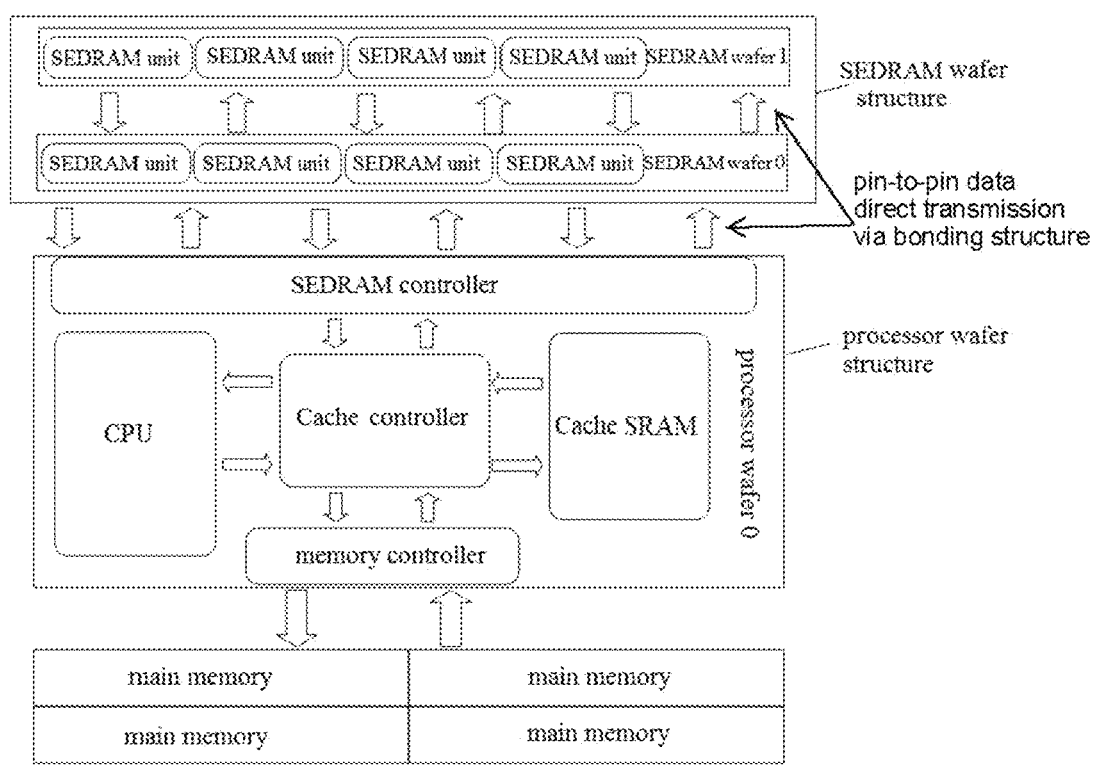
FIG. 4 is a schematic diagram of a stacked Cache system including a SEDRAM and a CPU according to an embodiment of the present disclosure.

Referring to FIG. 2 and FIG. 4, this embodiment provides a SEDRAM-based stacked Cache system. The stacked Cache system is integrated in multiple layers of wafers bonded together, and includes a Cache, a Cache controller and a SEDRAM controller. The SEDRAM controller may be configured as single-channel or multi-channel parallel access. Depending on the number of banks of the SEDRAM, the stacked Cache system may include one or more SEDRAM controllers.

The multiple layers of wafers include a SEDRAM wafer structure and a processor wafer structure, the SEDRAM wafer structure includes at least one layer of SEDRAM wafer, and the processor wafer structure includes at least one layer of processor wafer. That is, the multiple layers of wafers bonded together may include one layer of processor wafer and one layer of SEDRAM wafer, or the multiple layers of wafers bonded together may include one layer of processor wafer and two layers of SEDRAM wafers, or the multiple layers of wafers bonded together may include two layers of processor wafers and one layer of SEDRAM wafer. The specific number of layers of the processor wafers in the processor wafer structure and the specific number of layers of the SEDRAM wafers in the SEDRAM wafer structure may be determined as required. For example, the stacked Cache system as illustrated in FIG. 4 includes two layers of SEDRAM wafers and one layer of processor wafer, i.e., the SEDRAM wafer 0, the SEDRAM wafer 1 and the processor wafer 0.

SEDRAM units are integrated in each layer of SEDRAM wafer in the SEDRAM wafer structure and configured as a part of a storage space of the Cache in the Cache system or configured as a part of a storage space of a level of Cache. As illustrated in FIG. 4, the SEDRAM units are integrated in the SEDRAM wafer 0 and the SEDRAM wafer 1, and a CPU, the SEDRAM controller, the Cache controller, a Cache SRAM and a memory controller are integrated in the processor wafer 0. The SEDRAM units are configured as a part of the storage space of the Cache in the Cache system to store Cache Data of a Cache Line, and Cache Control of the Cache Line is stored in the Cache SRAM. Data is transferred between wafers through a bonding structure in pin-to-pin data direct transmission. It should be noted that the expression "between wafers" may refer to between the SEDRAM wafer and the processor wafer, between any two SEDRAM wafers, or between any two processor wafers.

All logical modules integrated on the multiple layers of wafers constitute a complete processor system. A main memory is generally integrated on a mainboard outside the chip. An entire SEDRAM wafer and an entire processor wafer may be bonded first and then sliced and packed.

Further, the Cache controller is a control core of the stacked Cache system, and may be configured to determine whether the Cache in the Cache system hits and send corresponding command operation and data interaction request to the CPU, the SEDRAM controller and the memory controller. The SEDRAM controller is configured to control reading or writing content in the SEDRAM unit. The Cache controller is further configured to read or write content in the Cache SRAM.

Specifically, the SEDRAM unit is used as a part of the storage space of the Cache in the Cache system to store the Cache Data; while the Cache SRAM is to store the Cache Control. The Cache Control includes a Cache State and a Cache Tag. Further, the Cache Control may also include Directory information.

The SEDRAM unit is adopted as a part of the storage space of the Cache or as a part of the storage space of a level of Cache in the Cache system, so that the Cache SRAM is able to store more Cache Control, and the capacity of the Cache is expanded to a level of GB (Gigabyte, $2^{20}$ bytes), which is improved by at least an order of magnitude as compared with the capacity of a traditional Cache. At the same time, a hit rate of the Cache is improved, reading speed of hot data is accelerated, a hit rate of the CPU to read inside data is improved, comprehensive performances of the system are improved, cost, power consumption and latency are reduced, and a data transmission average bandwidth of memory system is increased significantly.

The SEDRAM-based stacked Cache system may be set-associative, direct-mapped, or fully-associative and so on. The stacked Cache system may be configured as a level of Cache in the processor system, and the remaining levels of Caches are usually implemented inside the CPU. Alternatively, the stacked Cache system may be configured as the only level of Cache in the processor system.

In the above-mentioned stacked Cache system, the SEDRAM unit is not integrated inside a processor chip, but is integrated on each layer of SEDRAM wafer in the SEDRAM wafer structure. Adopting the SEDRAM unit as the storage space of the Cache in the Cache system may improve an access bandwidth, realize fast and short-distance data transmission between wafers with different functions and different processes, and effectively break through the limitation of a "Memory Wall" to create real storage-computing integration. In addition, the capacity of Cache may be increased greatly, a hit rate of the Cache is improved, reading speed of hot data is accelerated, a hit rate of the CPU to read inside data is improved, comprehensive performances of the system are improved, and the cost, power consumption and latency are reduced.

Embodiment 3

Figure 5:
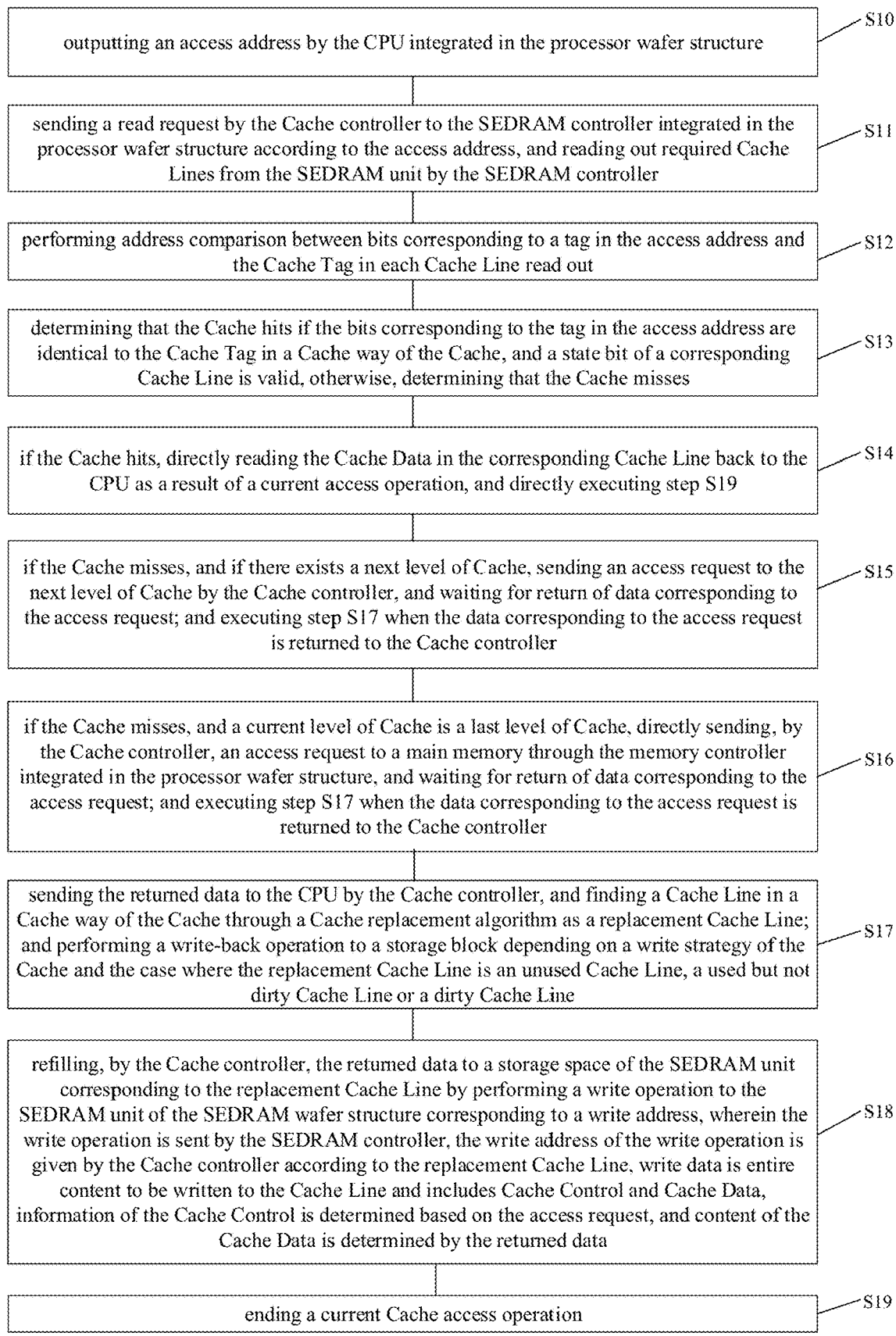
FIG. 5 is a schematic flowchart of a Cache controlling method according to an embodiment of the present disclosure, where a SEDRAM is adopted as an overall storage space of a Cache.

Referring to FIG. 5, this embodiment provides a Cache controlling method for the stacked Cache system as described in any embodiments hereinbefore. The SEDRAM unit integrated in each layer of SEDRAM wafer in the SEDRAM wafer structure is controlled by the Cache controlling method as an overall storage space of the Cache in the Cache system, and both Cache Control and Cache Data are stored in the SEDRAM unit.

The Cache controlling method includes the following steps:
step S10: outputting an access address by the CPU integrated in the processor wafer structure;
step S11: sending a read request by the Cache controller to the SEDRAM controller integrated in the processor wafer structure according to the access address, and reading out required Cache Lines from the SEDRAM unit by the SEDRAM controller, wherein each Cache Line includes the Cache Control and the Cache Data, and the Cache Control includes a Cache State and a Cache Tag;
step S12: performing address comparison between bits corresponding to a tag in the access address and the Cache Tag in each Cache Line read out;
step S13: determining that the Cache hits if the bits corresponding to the tag in the access address are identical to the Cache Tag in a Cache way of the Cache, and a state bit of a corresponding Cache Line is valid, otherwise, determining that the Cache misses;
step S14: if it is determined that the Cache hits, directly reading the Cache Data in the corresponding Cache Line back to the CPU as a result of a current access operation, and directly executing step S19;

step S15: if it is determined that the Cache misses, and if there exists a next level of Cache, sending an access request to the next level of Cache by the Cache controller, and waiting for return of data corresponding to the access request; and executing step S17 when the data corresponding to the access request is returned to the Cache controller;

step S16: if it is determined that the Cache misses, and a current level of Cache is a last level of Cache, directly sending, by the Cache controller, an access request to a main memory through the memory controller integrated in the processor wafer structure, and waiting for return of data corresponding to the access request; and executing step S17 when the data corresponding to the access request is returned to the Cache controller;

step S17: sending the returned data to the CPU by the Cache controller, and finding a Cache Line in a Cache way of the Cache through a Cache replacement algorithm as a replacement Cache Line; and performing a write-back operation to a storage block depending on a write strategy of the Cache and the case where the replacement Cache Line is an unused Cache Line, a used but not dirty Cache Line or a dirty Cache Line, wherein the Cache replacement algorithm includes a random replacement algorithm (referred as "Random" for short), a least recently used replacement algorithm (referred as "LRU" for short), a least frequently used replacement algorithm (referred as "LFU" for short) or a first in first out replacement algorithm (referred as "FIFO" for short) and the like, and the write strategy of the Cache includes a write back strategy, a write through strategy and the like.

step S18: refilling, by the Cache controller, the returned data to a storage space of the SEDRAM unit corresponding to the replacement Cache Line by performing a write operation to the SEDRAM unit of the SEDRAM wafer structure corresponding to a write address, wherein the write operation is sent by the SEDRAM controller, the write address of the write operation is given by the Cache controller according to the replacement Cache Line found out in step S17, write data is entire content to be written to the Cache Line and includes Cache Control and Cache Data, information of the Cache Control is determined based on the access request, and content of the Cache Data is determined by the returned data; and step S19: ending a current Cache access operation.

In the following, illustration will be made with reference to a single-core processor. Because the processor wafer and the SEDRAM wafer integrated with the SEDRAM unit are in a stacked structure, a large capacity and high bandwidth are provided. The stacked Cache of the single-core processor is a 1 GB Cache, which is four-way set-associative Cache, each Cache way has a capacity of $2^{18}$ bytes and $2^{11}$ Cache Lines, so each Cache Line has a capacity of $2^7$ bytes, which corresponds to 1024 bits. The Cache replacement algorithm is the random replacement algorithm, and the write strategy of a replacement block of the Cache is the write back strategy. The Cache State has two bits, one is a valid bit to indicate whether the Cache Data is valid, and the other one is a dirty bit to indicate whether the Cache has been written, i.e., to indicate whether the Cache is consistent with the next-level storage system. The access address of CPU is 40 bits.

When applied to the above single-core processor, the above-mentioned Cache controlling method may include the following steps.

In step S10: the CPU (a single-core processor) provides a 40-bit physical access address, 1fc0000000 in hexadecimal or 0001 1111 1100 0000 0000 0000 0000 0000 0000 0000 in binary.

In step S11: based on the access address, the Cache controller sends a request for accessing the address 1fc0000000 to SEDRAM controller, and the SEDRAM controller reads out required Cache Lines of the 4 Cache ways from the SEDRAM unit. It should be illustrated that the lower 7 bits (i.e., [6:0], 0000000) in the access address is an inline address of a Cache Line, called Offset, which is an address to find out corresponding bytes in the Cache Line; and the next 11 bits (i.e., [17:7], 00000000000) in the access address is an address of a Cache Line, called Index, which is an address to locate a specific Cache Line. According to the address ([17:7], 00000000000), Cache Lines at the $0^{th}$ row of the 4 Cache ways are read out.

In step S12: bits corresponding to a tag in the access address, i.e., higher 22 bits ([39:18], 0001 1111 1100 0000 0000 00), are compared with the Cache Tag in each Cache Line read out from the SEDRAM unit.

In step S13: the result of the above comparison shows that the bits (i.e., [39:18], 0001 1111 1100 0000 0000 00)) corresponding to the tag in the access address are identical to the Cache Tag in a Cache way (such as way 01) of the Cache, and the state bit of the Cache Line corresponding to this Cache way is valid, that is the valid bit is 1, it is determined that the Cache hits.

In step S14: when it is determined that the Cache hits, content in the Cache Data of the corresponding Cache Line is read back to CPU as the result of the current access operation, and execute step S19.

In step S19: the current Cache access operation ends.

The SEDRAM unit is adopted as the overall storage space of the Cache or as the overall storage space of a level of Cache in the Cache system, and the processor wafer is directly bonded with the SEDRAM wafer having the SEDRAM unit integrated therein, so that the capacity of Cache is expanded to a level of GB (Gigabyte, $2^{20}$ bytes), which is improved by at least an order of magnitude as compared with the capacity of a traditional Cache. At the same time, a hit rate of the Cache is improved, reading speed of hot data is accelerated, a hit rate of the CPU to read inside data is improved, comprehensive performances of the system are improved, and cost, power consumption and latency are reduced. Besides, a data transmission average bandwidth of memory system is increased significantly, storage resources of a processor chip are saved, so that more processing logics (such as more artificial intelligence (AI) cores or other coprocessor cores) are integrated on a chip of the same size to achieve more functions and stronger computing capability.

Embodiment 4

Figure 6:
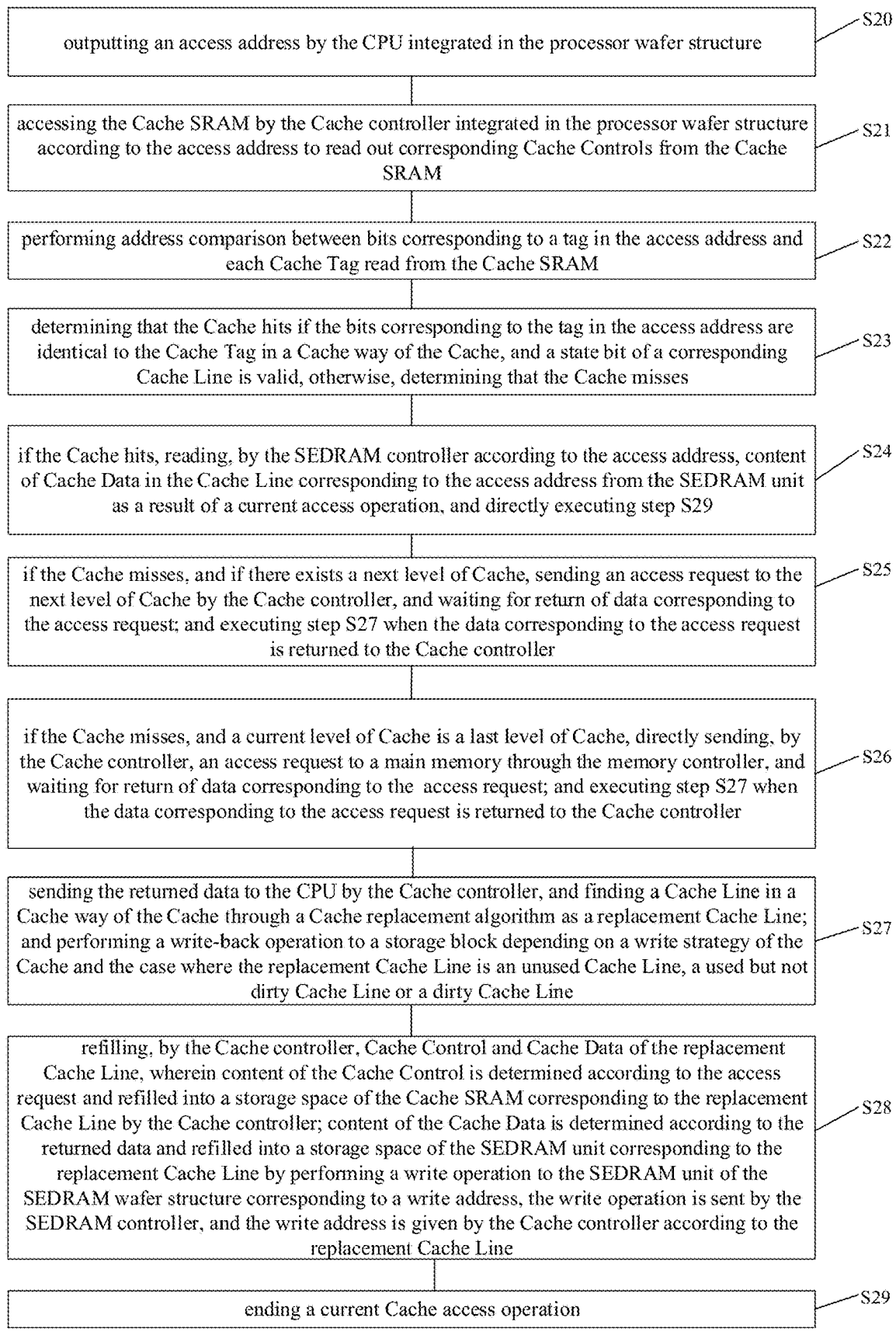
FIG. 6 is a schematic flowchart of a Cache controlling method according to an embodiment of the present disclosure, where a SEDRAM is adopted as a part of a storage space of a Cache.

Referring to FIG. 6, this embodiment provides a Cache controlling method for the stacked Cache system as described in any embodiments hereinbefore. The SEDRAM unit integrated in each layer of SEDRAM wafer in the SEDRAM wafer structure is controlled by the Cache controlling method as a part of the storage space of the Cache of the Cache system, Cache Data is stored in the SEDRAM unit, and Cache Control is stored in the Cache SRAM, which is integrated in the processor wafer structure together with the CPU.

The Cache controlling method includes the following steps:
- step S20: outputting an access address by the CPU integrated in the processor wafer structure;
- step S21: accessing the Cache SRAM by the Cache controller integrated in the processor wafer structure according to the access address to read out corresponding Cache Controls from the Cache SRAM, wherein each Cache Control read from the Cache SRAM includes a Cache State and a Cache Tag;
- step S22: performing address comparison between bits corresponding to a tag in the access address and each Cache Tag read from the Cache SRAM;
- step S23: determining that the Cache hits if the bits corresponding to the tag in the access address are identical to the Cache Tag in a Cache way of the Cache, and a state bit of a corresponding Cache Line is valid, otherwise, determining that the Cache misses;
- step S24: if it is determined that the Cache hits, reading, by the SEDRAM controller integrated in the processor wafer structure according to the access address, content of Cache Data in the Cache Line corresponding to the access address from the SEDRAM unit as a result of a current access operation, and directly executing step S29;
- step S25: if it is determined that the Cache misses, and if there exists a next level of Cache, sending an access request to the next level of Cache by the Cache controller, and waiting for return of data corresponding to the access request; and executing step S27 when the data corresponding to the access request is returned to the Cache controller;
- step S26: if it is determined that the Cache misses, and a current level of Cache is a last level of Cache, directly sending, by the Cache controller, an access request to a main memory through the memory controller, and waiting for return of data corresponding to the access request; and executing step S27 when the data corresponding to the access request is returned to the Cache controller;
- step S27: sending the returned data to the CPU by the Cache controller, and finding a Cache Line in a Cache way of the Cache through a Cache replacement algorithm as a replacement Cache Line; and performing a write-back operation to a storage block depending on a write strategy of the Cache and the case where the replacement Cache Line is an unused Cache Line, a used but not dirty Cache Line or a dirty Cache Line;
- step S28: refilling, by the Cache controller, Cache Control and Cache Data of the replacement Cache Line, wherein content of the Cache Control is determined according to the access request and refilled into a storage space of the Cache SRAM corresponding to the replacement Cache Line by the Cache controller; content of the Cache Data is determined according to the returned data and refilled into a storage space of the SEDRAM unit corresponding to the replacement Cache Line by performing a write operation to the SEDRAM unit of the SEDRAM wafer structure corresponding to a write address, the write operation is sent by the SEDRAM controller, and the write address is given by the Cache controller according to the replacement Cache Line; and
- step S29: ending a current Cache access operation.

In the following, illustration will be made with reference to a single-core processor. Because the processor wafer and the SEDRAM wafer integrated with the SEDRAM unit are in a stacked structure, a large capacity and high bandwidth are provided. The stacked Cache of the single-core processor is a 2 GB Cache, which is eight-way set-associative Cache, each Cache way has a capacity of $2^{18}$ bytes and $2^{12}$ Cache Lines, so each Cache Line has a capacity of $2^6$ bytes, which corresponds to 512 bits. The Cache replacement algorithm is the LRU replacement algorithm, and the write strategy of a replacement block of the Cache is the write back strategy. The Cache State has two bits, one is a valid bit to indicate whether the Cache Data is valid, and the other one is a dirty bit to indicate whether the Cache has been written. The access address of CPU is 48 bits.

When applying the above-mentioned Cache controlling method to the above single-core processor, Cache access steps may include the following content.

In step S20: the CPU provides a 48-bit physical access address, 8e0005800000 in hexadecimal or 1000 1110 0000 0000 0000 0101 1000 0000 0000 0000 0000 0000 in binary.

In step S21: based on the access address, the Cache controller first accesses the Cache SRAM having Cache Control (including Cache State and Cache Tag) stored therein to read out the respective Cache States and Cache Tags of the 8 Cache ways. It should be illustrated that the lower 6 bits (i.e., [5:0], 000000) in the access address is an inline address of a Cache Line, called Offset, which is an address to find out corresponding bytes in the Cache Line; and the next 12 bits (i.e., [17:6], 000000000000) in the access address is an address of a Cache Line, called Index, which is an address to locate a specific Cache Line. According to the address ([17:6], 000000000000), Cache Control information are read out from the $0^{th}$ row of each of the 8 Cache ways of Cache SRAM.

In step S22: bits corresponding to a tag in the access address, i.e., higher 30 bits ([47:18], 100011100000000000000101100000), are compared with the Cache Tag in each of 8 Cache Lines read out from the SEDRAM unit.

In step S23: the result of the above comparison shows that none of the 8 Cache Tags read out from the Cache SRAM is consistent with the bits (100011100000000000000101100000) corresponding to the tag in the access address, then it is determined that the Cache misses, and execute step S25.

In step S25, the Cache misses and there is no next level of Cache.

In step S26, if the Cache misses and a current level of Cache is a last level of Cache, the Cache controller directly sends an access request to a main memory through the memory controller according to the access address (8e0005800000), and waits for return of data corresponding to the access request; and step S27 is executed when the data corresponding to the access request is returned to the Cache controller.

In step S27: the Cache controller sends the returned data to the CPU, and finds out a Cache Line in a least recently used Cache way from the 8 Cache ways through the Cache replacement algorithm LRU as a replacement Cache Line. The dirty bit of the replacement Cache Line is 1, indicating that the replacement Cache Line is a dirty Cache Line, and the write strategy is write back. A write-back operation to a storage block is performed to write the dirty data in this Cache Line in the SEDRAM unit back to an address corresponding to the main memory. The address in hexadecimal is 1f0005800000.

In step S28: after the data corresponding to the access address 8e0005800000 is returned, the Cache controller refills Cache Control information to the Cache SRAM according to the replacement Cache Line found out in step S27, and sends a request to the SEDRAM controller to refill the Cache Data. In the Cache State of the storage space of the Cache SRAM corresponding to the replacement Cache Line, the valid bit is 1, and the dirty bit is 0. The Cache Tag is refilled with the content of the [47:18] bits (100011100000000000000101100000) in the access address, and content of the Cache Data is refilled into the storage space of the SEDRAM unit corresponding to the replacement Cache Line by the SEDRAM controller.

In step S29: as a single-core processor, the current Cache access operation ends.

The SEDRAM unit is adopted as a part of the storage space of the Cache or as a part of the storage space of a level of Cache in the Cache system, so that the Cache SRAM is able to store more Cache Control, and the capacity of the Cache is expanded to a level of GB (Gigabyte, $2^{20}$ bytes), which is improved by at least an order of magnitude as compared with the capacity of a traditional Cache. At the same time, a hit rate of the Cache is improved, reading speed of hot data is accelerated, a hit rate of the CPU to read inside data is improved, comprehensive performances of the system are improved, cost, power consumption and latency are reduced, and a data transmission average bandwidth of memory system is increased significantly Embodiment 5

This embodiment provides a stacked Cache device, which includes the stacked Cache system as described in any of the embodiments hereinbefore.

It should be noted that the capacity of the Cache mentioned in embodiments of the present disclosure is not the highest capacity achievable by the present disclosure. The capacity of the Cache is closely related to the area of the processor chip, the integration density of the SEDRAM units, the stacking layers of the SEDRAM wafers, and the manufacturing process of the SEDRAMs, and the larger the area of the processor chip, the higher the density of the SEDRAM wafer, the more the SEDRAM wafer layers and the more advanced the manufacturing process of the stackable SEDRAM is, the larger the capacity of the Cache is, which can reach 4 GB, 8 GB or even higher.

In present disclosure, the SEDRAM is adopted as the storage space of Cache. The Cache mentioned herein may refer to all the Caches in the processor system arranged on the SEDRAM wafer as a whole, or may refer to a level of the Caches arranged on the SEDRAM wafer, and the other levels of the Caches in the processor system may be integrated in the CPU or arranged at the periphery of the CPU, and the other levels of the Caches may be SRAMs, DRAMs, high bandwidth memories (HBMs), etc. All these cases do not affect the protection scope of the present disclosure.

It should be noted that, in the present disclosure, terms like "first" and "second" are only used to distinguish one entity or operation from another, and are not intended to indicate or imply such actual relationship or sequence among these entities or operations. Moreover, terms such as "comprising", "including" and/or "containing" and any other related variants thereof are intended to encompass non-exclusive inclusion, such that besides a series of elements explicitly listed, a process, a method, an article or a device may also include some elements not explicitly listed or some inherent elements. Without further restriction, an element defined by the phrase "comprising a/an . . . " does not preclude the presence of additional identical elements in the process, method, article or apparatus that includes the element.

The above descriptions only involve preferred embodiments of the present disclosure, and are not intended to limit the present disclosure. It will be understood by those skilled in the art that, the present disclosure may have various modifications and changes, and any modification, equivalent replacement and improvement made within the spirit and principle of the present disclosure shall be included within the protection scope of the present disclosure. It should be noted that like reference numerals and letters in the accompanying drawings refer to like items, so once an item is defined in one figure, it does not need further definition and explanation in subsequent figures. The above descriptions only involve preferred embodiments of the present disclosure, and are not intended to limit the present disclosure. It will be understood by those skilled in the art that, the present disclosure may have various modifications and changes, and any modification, equivalent replacement and improvement made within the spirit and principle of the present disclosure shall be included within the protection scope of the present disclosure.

What is claimed is:

1. A stacking embedded dynamic random access memory SEDRAM-based stacked Cache system, integrated in multiple layers of wafers bonded together, and comprising a Cache, a Cache controller and a SEDRAM controller; wherein:
    the multiple layers of wafers comprise a SEDRAM wafer structure and a processor wafer structure;
    the SEDRAM wafer structure comprises at least one layer of SEDRAM wafer, and a SEDRAM unit is integrated in each layer of SEDRAM wafer in the SEDRAM wafer structure and configured as a storage space of the Cache;
    the processor wafer structure comprises at least one layer of processor wafer; and a CPU, the Cache controller, the SEDRAM controller and a memory controller are integrated in the processor wafer structure;
    the Cache controller is configured to determine whether the Cache hits, and send corresponding command operation and data interaction request to the CPU, the SEDRAM controller and the memory controller;
    the SEDRAM controller is configured to control reading or writing content in the SEDRAM unit;
    the memory controller is configured to control access to a main memory; and
    data is transferred between wafers through a bonding structure in pin-to-pin data direct transmission, comprising:
        pin-to-pin data direct transmission between the SEDRAM wafer of the SEDRAM wafer structure and the processor wafer of the processor wafer structure through a bonding structure;
        pin-to-pin data direct transmission between the SEDRAM wafers of the SEDRAM wafer structure through a bonding structure; and
        pin-to-pin data direct transmission between the processor wafers of the processor wafer structure through a bonding structure.

2. The stacked Cache system of claim 1, wherein content stored in the SEDRAM unit comprises Cache Control and Cache Data, and the Cache Control comprises a Cache State and a Cache Tag, wherein the Cache Control further comprises Directory information.

3. The stacked Cache system of claim 1, wherein the processor wafer structure further comprises a Cache static random-access memory SRAM integrated therein, and the SEDRAM unit and the Cache SRAM are configured as the storage space of the Cache.

4. The stacked Cache system of claim 3, wherein the Cache controller is configured to determine whether the Cache hits, and send corresponding command operation and data interaction request to the CPU, the SEDRAM controller and the memory controller;
the SEDRAM controller is configured to control reading or writing content in the SEDRAM unit; and
the Cache controller is further configured to read out or write content in the Cache SRAM.

5. The stacked Cache system of claim 4, wherein the content stored in the SEDRAM unit is a Cache Data, the content stored in the Cache SRAM is Cache Control, and the Cache Control comprises a Cache State and a Cache Tag,
wherein the Cache Control further comprises Directory information.

6. The stacked Cache system of claim 1, wherein the SEDRAM unit is configured as a storage space for any level of the Cache.

7. The stacked Cache system of claim 1, wherein the processor wafer structure comprises two or more layers of processor wafers, and the SEDRAM wafer structure comprises two or more layers of SEDRAM wafers.

8. The stacked Cache system of claim 1, wherein the processor wafer structure comprises two or more layers of processor wafers, and the SEDRAM wafer structure comprises one layer of SEDRAM wafer; or
the processor wafer structure comprises one layer of processor wafer, and the SEDRAM wafer structure comprises two or more layers of SEDRAM wafers.

9. The stacked Cache system of claim 1, wherein the processor wafer structure comprises one layer of processor wafer, and the SEDRAM wafer structure comprises one or two layers of SEDRAM wafers.

10. The stacked Cache system of claim 1, wherein the processor wafer structure comprises one or two layers of processor wafers, and the SEDRAM wafer structure comprises one layer of SEDRAM wafer.

11. A SEDRAM-based stacked Cache device, comprising a stacked Cache system of claim 1.

12. The SEDRAM-based stacked Cache device of claim 11, wherein the Cache controller is configured to determine whether the Cache hits, and send corresponding command operation and data interaction request to the CPU, the SEDRAM controller and the memory controller; and
the SEDRAM controller is configured to control reading or writing content in the SEDRAM unit;
wherein content stored in the SEDRAM unit comprises Cache Control and Cache Data, and the Cache Control comprises a Cache State, a Cache Tag and Directory information.

13. The SEDRAM-based stacked Cache device of claim 11, wherein the processor wafer structure further comprises a Cache static random-access memory SRAM integrated therein, and the SEDRAM unit and the Cache SRAM are configured as the storage space of the Cache.

14. The SEDRAM-based stacked Cache device of claim 13, wherein the Cache controller is configured to determine whether the Cache hits, and send corresponding command operation and data interaction request to the CPU, the SEDRAM controller and the memory controller;
the SEDRAM controller is configured to control reading or writing content in the SEDRAM unit; and
the Cache controller is further configured to read out or write content in the Cache SRAM.

15. The SEDRAM-based stacked Cache device of claim 14, wherein the content stored in the SEDRAM unit is a Cache Data, the content stored in the Cache SRAM is Cache Control, and the Cache Control comprises a Cache State, a Cache Tag, and Directory information.

16. The SEDRAM-based stacked Cache device of claim 14, wherein the processor wafer structure comprises two or more layers of processor wafers, and the SEDRAM wafer structure comprises two or more layers of SEDRAM wafers; or
the processor wafer structure comprises two or more layers of processor wafers, and the SEDRAM wafer structure comprises one layer of SEDRAM wafer; or
the processor wafer structure comprises one layer of processor wafer, and the SEDRAM wafer structure comprises two or more layers of SEDRAM wafer.

17. The SEDRAM-based stacked Cache device of claim 11, wherein:
the processor wafer structure comprises one layer of processor wafer, and the SEDRAM wafer structure comprises one or two layers of SEDRAM wafers; or
the processor wafer structure comprises one or two layers of processor wafers, and the SEDRAM wafer structure comprises one layer of SEDRAM wafer.

18. A Cache controlling method for a stacking embedded dynamic random access memory SEDRAM-based stacked Cache system,
wherein the SEDRAM-based stacked Cache system is integrated in multiple layers of wafers bonded together, and comprises a Cache, a Cache controller and a SEDRAM controller;
the multiple layers of wafers comprise a SEDRAM wafer structure and a processor wafer structure;
the SEDRAM wafer structure comprises at least one layer of SEDRAM wafer, and a SEDRAM unit is integrated in each layer of SEDRAM wafer in the SEDRAM wafer structure and configured as a storage space of the Cache;
the processor wafer structure comprises at least one layer of processor wafer; and a CPU, the Cache controller, the SEDRAM controller and a memory controller are integrated in the processor wafer structure; and
data is transferred between wafers through a bonding structure in pin-to-pin data direct transmission, which comprises:
pin-to-pin data direct transmission between the SEDRAM wafer of the SEDRAM wafer structure and the processor wafer of the processor wafer structure through a bonding structure;
pin-to-pin data direct transmission between the SEDRAM wafers of the SEDRAM wafer structure through a bonding structure; and
pin-to-pin data direct transmission between the processor wafers of the processor wafer structure through a bonding structure,
wherein the SEDRAM unit integrated in each layer of SEDRAM wafer in the SEDRAM wafer structure is controlled by the Cache controlling method as an overall storage space of the Cache, and both Cache Control and Cache Data are stored in the SEDRAM unit,
wherein the Cache controlling method comprises:
step 1: outputting an access address by the CPU integrated in the processor wafer structure;

step 2: sending a read request by the Cache controller integrated in the processor wafer structure to the SEDRAM controller integrated in the processor wafer structure according to the access address, and reading out Cache Lines from the SEDRAM unit by the SEDRAM controller, wherein each Cache Line comprises the Cache Control and the Cache Data, and the Cache Control comprises a Cache State and a Cache Tag;

step 3: performing address comparison between bits corresponding to a tag in the access address and the Cache Tag in each Cache Line read out;

step 4: determining that the Cache hits if the bits corresponding to the tag in the access address are identical to the Cache Tag in a Cache way of the Cache, and a state bit of a corresponding Cache Line is valid, otherwise, determining that the Cache misses;

step 5: if it is determined that the Cache hits, directly reading, by the Cache controller, the Cache Data in the corresponding Cache Line back to the CPU as a result of a current access operation, and directly executing step 10;

step 6: if it is determined that the Cache misses, and if there exists a next level of Cache, sending an access request to the next level of Cache by the Cache controller, and waiting for return of data corresponding to the access request; and executing step 8 when the data corresponding to the access request is returned to the Cache controller;

step 7: if it is determined that the Cache misses, and a current level of Cache is a last level of Cache, directly sending, by the Cache controller, an access request to a main memory through the memory controller integrated in the processor wafer structure, and waiting for return of data corresponding to the access request; and executing step 8 when the data corresponding to the access request is returned to the Cache controller;

step 8: sending the returned data to the CPU by the Cache controller, and finding a Cache Line in a Cache way of the Cache through a Cache replacement algorithm as a replacement Cache Line; and performing a write-back operation to a storage block depending on a write strategy of the Cache and the case where the replacement Cache Line is an unused Cache Line, a used but not dirty Cache Line or a dirty Cache Line;

step 9: refilling, by the Cache controller, the returned data to a storage space of the SEDRAM unit corresponding to the replacement Cache Line by performing a write operation to the SEDRAM unit of the SEDRAM wafer structure corresponding to a write address, wherein the write operation is sent by the SEDRAM controller, the write address of the write operation is given by the Cache controller according to the replacement Cache Line found out in step 8, write data is entire content to be written to the Cache Line and comprises Cache Control and Cache Data, information of the Cache Control is determined based on the access request, and content of the Cache Data is determined by the returned data; and step 10: ending a current Cache access operation.

19. A Cache controlling method for a stacking embedded dynamic random access memory SEDRAM-based stacked Cache system, wherein the SEDRAM-based stacked Cache system is integrated in multiple layers of wafers bonded together, and comprises a Cache, a Cache controller and a SEDRAM controller;

the multiple layers of wafers comprise a SEDRAM wafer structure and a processor wafer structure;

the SEDRAM wafer structure comprises at least one layer of SEDRAM wafer, and a SEDRAM unit is integrated in each layer of SEDRAM wafer in the SEDRAM wafer structure and configured as a storage space of the Cache;

the processor wafer structure comprises at least one layer of processor wafer; and a CPU, the Cache controller, the SEDRAM controller and a memory controller are integrated in the processor wafer structure; and data is transferred between wafers through a bonding structure in pin-to-pin data direct transmission, which comprises:
pin-to-pin data direct transmission between the SEDRAM wafer of the SEDRAM wafer structure and the processor wafer of the processor wafer structure through a bonding structure;
pin-to-pin data direct transmission between the SEDRAM wafers of the SEDRAM wafer structure through a bonding structure; and
pin-to-pin data direct transmission between the processor wafers of the processor wafer structure through a bonding structure, wherein the processor wafer structure further comprises a Cache static random-access memory SRAM integrated therein, and the SEDRAM unit and the Cache SRAM are configured as the storage space of the Cache, wherein the SEDRAM unit integrated in each layer of SEDRAM wafer in the SEDRAM wafer structure is controlled by the Cache controlling method as a part of the storage space of the Cache, Cache Data is stored in the SEDRAM unit, and Cache Control is stored in the Cache SRAM integrated in the processor wafer structure, wherein the Cache controlling method comprises:
step 1: outputting an access address by the CPU integrated in the processor wafer structure;

step 2: accessing the Cache SRAM by the Cache controller integrated in the processor wafer structure according to the access address to read out corresponding Cache Controls from the Cache SRAM, wherein each Cache Control read from the Cache SRAM comprises a Cache State and a Cache Tag;

step 3: performing address comparison between bits corresponding to a tag in the access address and each Cache Tag read from the Cache SRAM;

step 4: determining that the Cache hits if the bits corresponding to the tag in the access address are identical to the Cache Tag in a Cache way of the Cache, and a state bit of a corresponding Cache Line is valid, otherwise, determining that the Cache misses;

step 5: if it is determined that the Cache hits, reading, by the SEDRAM controller integrated in the processor wafer structure according to the access address, content of Cache Data in the Cache Line corresponding to the access address from the SEDRAM unit as a result of a current access operation, and directly executing step 10;

step 6: if it is determined that the Cache misses, and if there exists a next level of Cache, sending an access request to the next level of Cache by the Cache controller, and waiting for return of data corresponding to the access request; and executing step 8 when the data corresponding to the access request is returned to the Cache controller;

step 7: if it is determined that the Cache misses, and a current level of Cache is a last level of Cache, directly sending, by the Cache controller, an access request to a main memory through the memory controller, and waiting for return of data corresponding to the access request; and executing step 8 when the data corresponding to the access request is returned to the Cache controller;

step 8: sending the returned data to the CPU by the Cache controller, and finding a Cache Line in a Cache way of the Cache through a Cache replacement algorithm as a replacement Cache Line; and performing a write-back operation to a storage block depending on a write strategy of the Cache and the case where the replacement Cache Line is an unused Cache Line, a used but not dirty Cache Line or a dirty Cache Line;

step 9: refilling, by the Cache controller, Cache Control and Cache Data of the replacement Cache Line, wherein content of the Cache Control is determined according to the access request and refilled into a storage space of the Cache SRAM corresponding to the replacement Cache Line by the Cache controller; content of the Cache Data is determined according to the returned data and refilled into a storage space of the SEDRAM unit corresponding to the replacement Cache Line by performing a write operation to the SEDRAM unit of the SEDRAM wafer structure corresponding to a write address, the write operation is sent by the SEDRAM controller, and the write address is given by the Cache controller according to the replacement Cache Line; and step 10: ending a current Cache access operation.

* * * * *